United States Patent [19]
Dugan et al.

[11] Patent Number: 5,683,788
[45] Date of Patent: Nov. 4, 1997

[54] APPARATUS FOR MULTI-COMPONENT PCB MOUNTING

[75] Inventors: Becky Dugan, Round Rock; Darrell J. Slupek, Austin, both of Tex.

[73] Assignee: Dell USA, L.P., Round Rock, Tex.

[21] Appl. No.: 592,947

[22] Filed: Jan. 29, 1996

[51] Int. Cl.$^6$ .............................. B32B 3/00; H05K 7/02; H05K 7/10; H01R 9/00
[52] U.S. Cl. .................... 428/209; 361/777; 361/767; 361/772; 361/774; 361/760; 361/761; 361/768; 174/261; 174/268; 174/263; 228/179.1; 228/180.1; 228/180.21; 228/180.22; 428/901
[58] Field of Search ........................... 361/777, 774, 361/772, 767, 760, 761, 764, 768; 228/179.1, 180.1, 180.21, 180.22; 174/255, 261, 263, 268; 428/209, 901

[56] References Cited

U.S. PATENT DOCUMENTS

| | | |
|---|---|---|
| 3,403,438 | 10/1968 | Best et al. .............................. 361/774 |
| 4,195,195 | 3/1980 | de Miranda et al. ..................... 361/777 |
| 4,883,920 | 11/1989 | Tanebe et al. ....................... 228/180.21 |
| 5,446,623 | 8/1995 | Kanetake ................................. 361/760 |
| 5,453,582 | 9/1995 | Amano et al. ........................... 174/261 |

*Primary Examiner*—Cathy Lam
*Attorney, Agent, or Firm*—Mark P. Kahler; Henry N. Garrana; Diana L. Roberts

[57] ABSTRACT

A printed circuit board includes a multi-component mounting footprint for mounting one of several possible differently sized discrete component packages on the circuit board. The multi-component mounting footprint includes a first mounting pad which has two connection points for mounting a connector on one of two different sized components. The footprint also includes a second mounting pad which is symmetric to the first mounting pad. About the mounting pads are cut outs which prevent solder buildup when either one of two different sized components are mounted thereon.

14 Claims, 4 Drawing Sheets

APPARATUS FOR MULTI-COMPONENT PCB MOUNTING

BACKGROUND

1. Field of the Invention

The present invention relates generally to circuit board component mounting, and more particularly to an electronic component mounting method and mounting pad design and construction.

2. Description of the Related Art

With the increasing demand and competition for electronic products, the construction and manufacturing cost of such products is becoming more and more critical. This is especially true with regard to products that create much of their market appeal from their small size. Integrated circuits and component packages within electronic products require substantial mounting space and layout planning on printed circuit boards (PCBs). With miniaturization, internal compartments and board bays are becoming smaller and smaller. Along with an increase in the number of integrated circuit packages being mounted within electronic devices, there is also a corresponding increase in the number of discrete components, such as resistors and capacitors, that are required to be included on PCBs.

Typically, a board layout is designed to accommodate the various integrated circuit packages (ICs) and the discrete components necessary for connection to the ICs, as well as conducting traces running along the surface of the PCB for connecting the packages and components. When surface mount technologies (SMT) are implemented in the board design, both the IC packages and the discrete components are mounted on and connected to one surface of the board rather than having the connections for such devices being routed through drilled holes to the other side of the board. Each of the integrated circuit chips has along one or more of its edges, a series of connection points. Such connection points may be on the sides of the chips, such as in dual in-line packages, or underneath the chips in pin grid arrays (PGA) or Ball Grid Array (BGA) packages. The connection points are connected to trace pads which then route signals to and from the other devices on the board.

For SMT discrete components such as resistors and capacitors, mounting pads are provided to receive the discrete component packages. Since there are several standard size packages for the discrete components, there are also several standard sized mounting "footprints" to accommodate the various sizes of the components. These discrete component mounting footprints usually include two oval-shaped mounting pads made of copper or other conductive material, which are arranged for connection to each end of a surface mounted component package. Since there are several different standard dimensional sizes for the component packages, there are also several corresponding dimensional footprints or layouts for the mounting pads and one size pad layout will not accommodate a different sized discrete component package.

During the design of a PCB layout, it is not always certain what size resistor or capacitor will be needed until the final circuit design has been completed. In many cases, the boards are ordered based upon an assumption that one size mounting footprint will be used, but when the final design is completed, a different size component is needed and therefore a different size mounting footprint is also required. In such a case, the inventory boards cannot be used and there is a delay in product announcement and loss in manufacturing time while new boards are ordered. In addition, since in many cases the boards cannot be applied to other device designs, the cost of the original supply of boards may be lost if the boards are not usable for other designs.

One way to resolve that problem is to maintain an inventory of boards which have several different sized mounting footprints so that if a component size changes during circuit design, the same board can still be used. That approach, however necessary, leaves an unused footprint space on the board. Thus valuable board area which is in high demand for integrated circuit packages and circuit board conductive traces, is left unused and unusable.

SUMMARY

It is therefore an object of the present invention to provide an improved component mounting apparatus for mounting one of a plurality of sizes of discrete component packages on printed circuit boards in a minimal amount of space.

In one embodiment of the present invention there is provided a circuit board including a component package mounting footprint arranged to have mounted thereon one of several variously sized discrete component packages in the board space typically required for just one of the various sizes of component packages.

In another aspect, it is a feature of the present invention to provide a mounting pad on a printed circuit board, for mounting a plurality of components of varying size. The mounting pad includes: a first connector pad, etched on a mounting side of the printed circuit board, the first connector pad having at least two connection points to which the components of varying size may be soldered; and a second connector pad, etched on the mounting side of the printed circuit board, electrically isolated from the first connector pad, the second connector pad also having at least two connection points to which said components of varying size may be soldered.

Another feature of the present invention is to provide the mounting pad as mentioned above where the first connector pad and the second connector pad are symmetric about an axis which is longitudinal between the first connector pad and the second connector pad.

It is yet another feature of the present invention to provide the mounting pad as mentioned above where the two connection points on the first connector pad include: a first connection point, to which a connector on one of the components of varying size may be soldered; and a second connection point, extending laterally outward from the first connection point, to which a connector on a second of the components of varying size, being larger than the other component of varying size, may be soldered.

Yet another feature of the present invention is to provide the mounting pad as mentioned above where the first connector pad and the second connector pad have cut outs, surrounding the two connection points, such that when the two connection points are soldered to connectors on the components of varying size, a cross section of the solder forms essentially a triangle.

Another feature of the present invention provides the mounting pad as mentioned above where the triangle has a concave top surface.

The foregoing has outlined rather broadly the objects, features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

DESCRIPTION OF THE DRAWINGS

A better understanding of the present invention can be obtained when the following detailed description of the preferred embodiment is considered in conjunction with the following drawings, in which.

DETAILED DESCRIPTION

The present invention will be explained in connection with the preferred embodiment as applicable to any electronic device where it is desirable to mount discrete component packages on a circuit board.

Figure 1:
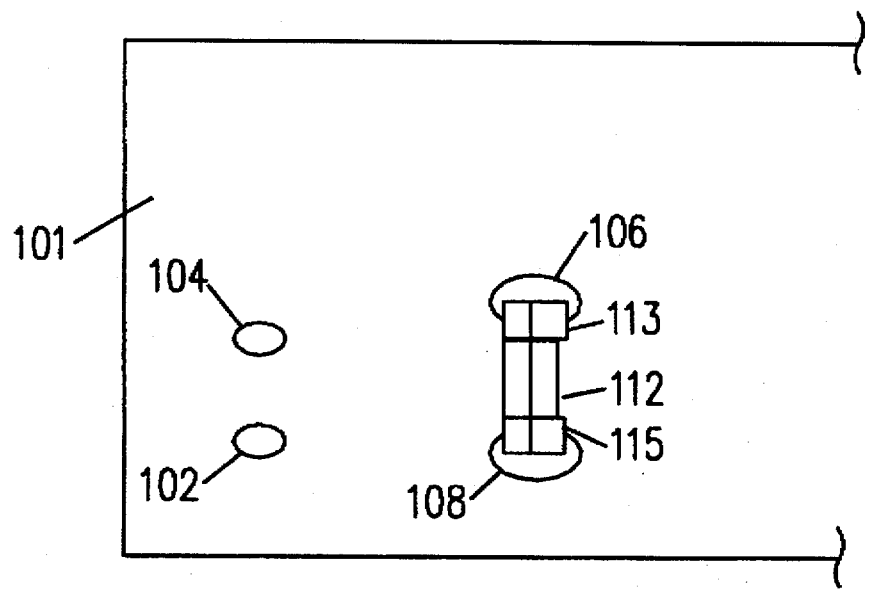
FIG. 1 is a schematic representation showing two different sizes of prior art mounting footprints, including an exemplary discrete component package, on the surface of a PCB.

Referring now to FIG. 1 in detail, there is shown a circuit board 101. The board 101 includes discrete component copper mounting pads 102 and 104. Also shown are a second set of discrete component copper mounting pads 106 and 108 which have, mounted upon them, a discrete component 112, which may be a resistor or a capacitor for example. The second set of pads 106 and 108 are larger than the first set 102 and 104 in order to accommodate a larger standard sized discrete component. The discrete component 112 includes first and second terminal sections or output terminals 113 and 115.

For surface mounted PCBs, "flat pack" discrete resistors and capacitors are implemented. These packages are flat and generally rectangular and come in many standard package sizes. The two common discrete component packages which are most frequently implemented and used for illustration purposes in the present example, are referred to as either the "0603" package or the "0805" package. The numeral designators of the packages refer to the dimensions of the package. For example the "0805" package is approximately 0.08 inches long by 0.05 inches wide. Similarly, the "0603" package is 0.06 inches long and 0.03 inches wide. Both packages are a common source for SMT resistors and capacitors and other discrete components of this size on most printed circuit boards. Each of these packages includes output terminals comprising copper bands at each end of the packages for electrical connection to copper mounting pads on PCBs. Typically, the component is placed in position on an appropriately sized mounting pad and then soldered in place by laying down a solder bead between the copper component terminals and the copper mounting pads on the PCB as shown in FIG. 1.

The present disclosure embodies a pad designed for a combination footprint so that either the 0603 SMT chip or the 0805 SMT chip (or any other pair of package sizes) may be populated on a PCB depending on purchasing availability or cost, while preserving board space. Without the pad design combination footprint as shown in detail in FIGS. 5-7, PCBs would have to have two individual footprints side-by-side, as shown in FIG. 1, which would waste board area. The only other option would be to include only one size mounting pad on the PCBs but that would restrict purchasing and layout design to only one size package.

Figure 2:
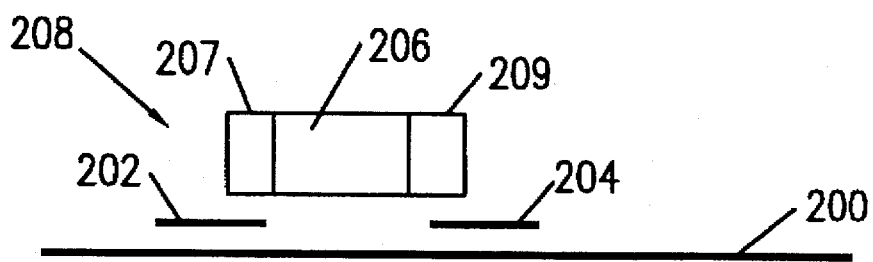
FIG. 2 is a schematic diagram illustrating the component, and the mounting pads as they are placed upon the PCB.

In FIG. 2, an exploded view shows a flat pack component package 206 arranged for mounting on mounting pads 202 and 204 on PCB 200. Flat pack 206 includes first and second terminal sections or terminal bands 207 and 209 which provide electrical connection to the pads 202 and 204 and also provide a soldering wall 208 to join with the mounting pad 202 for mounting and maintaining the flat pack 206 in situ on the board 200 as illustrated in FIG. 3.

Figure 3:
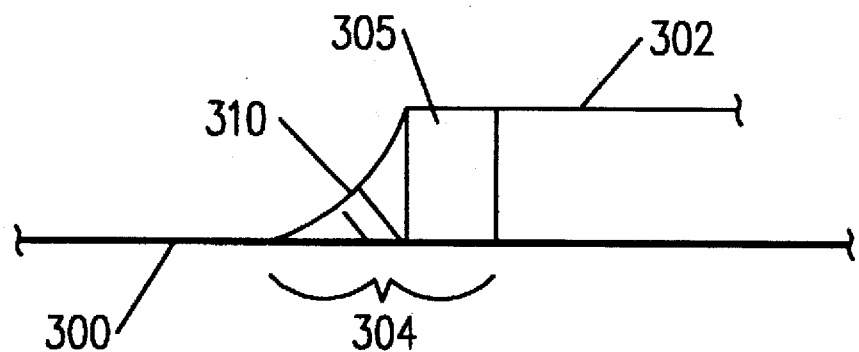
FIG. 3 is a detailed illustration of a discrete component and its soldered connection to a PCB.

In FIG. 3, a flat pack 302 is mounted on a component mounting pad 304 on a circuit board 300. The component mounting pad lies in substantially the same plane as the circuit board 300. The flat pack 302 includes a first terminal section or output terminal band 305. As shown, when the flat pack 302 is properly mounted, a substantially triangular solder fillet or joint 310 is evenly placed with a slight concavity between the wall of the package terminal 305 and the underlying mounting pad or first terminal section 304. The solder concavity applies similar evenly distributed pressures to the component package 302 and also the board 300.

Figure 4:
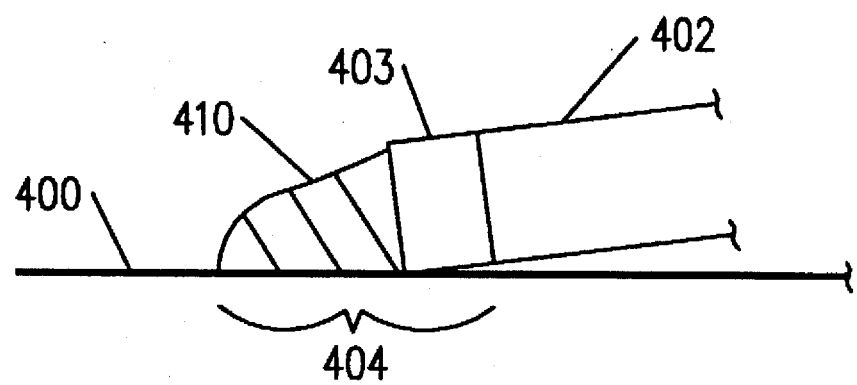
FIG. 4 is an illustration of a soldering problem known as "tombstoning"

In FIG. 4, a board 400 also includes a mounting pad 404 upon which is placed a component package 402. The component package 402 includes a first terminal section or terminal band 403 which is soldered by solder bead 410 to the mounting pad 404 on the surface of the board 400. As illustrated, when the mounting pad extends too far away from the component package 402, a problem known as "tombstoning" occurs, i.e. the mass of the solder becomes too large and overpowers the component package resulting in a misalignment and faulty of the component package. When "tombstoning" occurs, it requires either scrapping the board or re-placing of a new flat pack and re-soldering. Accordingly, a multi-component mounting pad cannot be fashioned merely by enlarging the mounting pads to accommodate the larger of two or more sized flat packs since when it is attempted to mount a smaller package on the larger pads, the solder will extend to the outer edges of the larger mounting pad and "tombstoning" will result.

Figure 5:
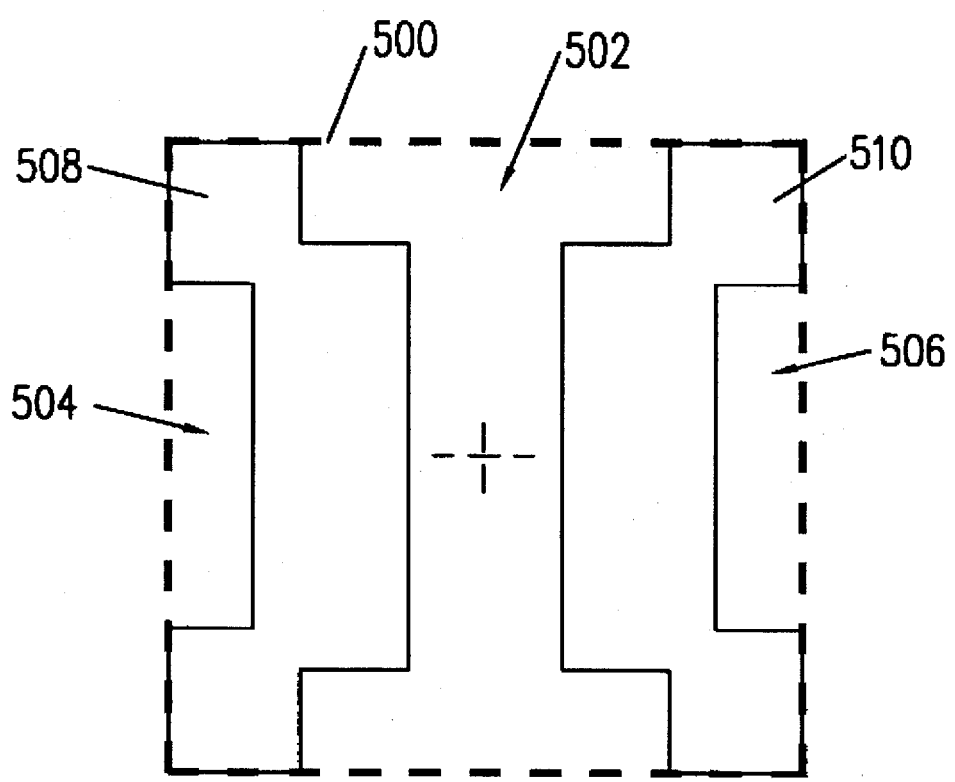
FIG. 5 shows the design of a discrete component mounting footprint in accordance with the teachings of the present invention.
Figure 6:
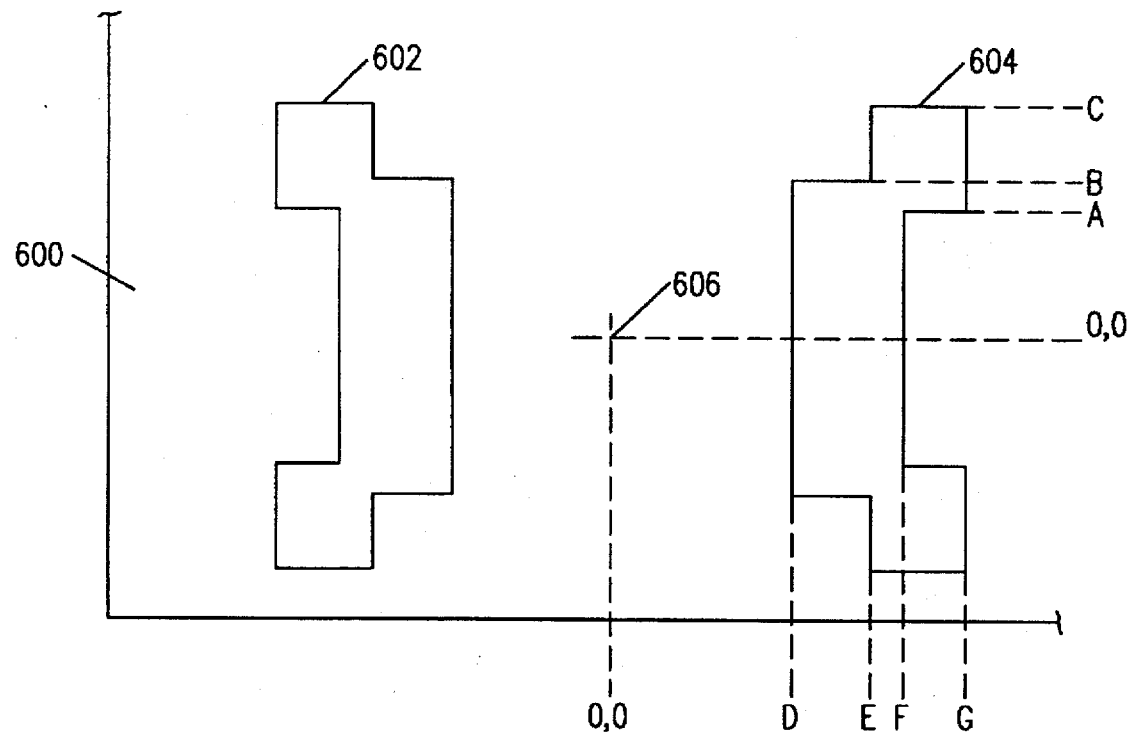
FIG. 6 illustrates exemplary typical dimensional relationships between various portions of the footprint shown in FIG. 5.
Figure 7:
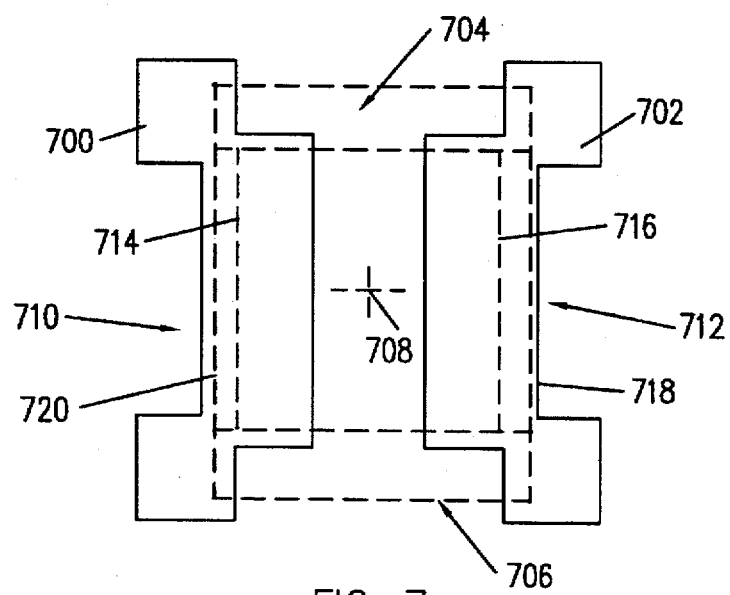
FIG. 7 illustrates how various component packages overlay the footprint mounting arrangement of the present invention.

To overcome the "tombstoning" problem and still provide a multi-component mounting arrangement which saves board space, the mounting pad design shown in FIGS. 5-7 has been provided. In FIG. 5, a substantially square base or perimeter area 500 is illustrated to have a central "T" section 502 cutout along with first and second side section cutouts 504 and 506 leaving first and second terminal connection pads or mounting pad sections 508 and 510. The perimeter area 500 is designed to be sufficiently large to enclose or surround the larger of at least two differently sized component packages therein. Thus, in the present example, the perimeter area 500 is designed to surround or enclose the larger "0805" component package of the two component packages ("0805" and "0603") which may be mounted. Each of the pad sections 508 and 510, which are of copper in the present example, but may be made of any conductive material which may be soldered to, is designed to be etched on a circuit board and soldered to corresponding output terminals of mounted flat pack components of one of at least two different sizes. Cutouts 504 and 506 are strategically made and positioned so that the smaller of two different sizes of flat pack components can be placed thereon and soldered with a uniform concave solder bead or joint resulting in a solid physical mounting and strong electrical connection. The outside corners of the pads 508 and 510 will not result in the "tombstoning" effect illustrated in connection with FIG. 4 since the leverage of the mounted component package is too great to overcome with the solder joint. The extended corners of the pads will therefore provide an even stronger bond to the mounted package with an increased solder buildup in the corners.

Thus, there is a single footprint with the pads designed so that either the package, for example either the "0805" or the smaller "0603", may be populated on a single footprint (rather than one of two separate juxtaposed footprints), which will therefore preserve a substantial portion of the space from the area typically consumed by two separate footprints. The mounting pad is designed so that the "0603" package will rest on the inner narrow parts of the pads and the "0805" package will rest over the inner half of the pad, and a solder joint will concentrate on each outer corner of the pad. A void is cut out of the outer edge of the pads to prevent too much solder buildup in the case the smaller package, in the present example the "0603" package, is placed.

FIG. 6 illustrates multi-size flat pack component mounting pads including first and second terminal connection pads or mounting pads 602 and 604 arranged on a PCB 600. The illustration shows a center point 606 defining "0,0" positions in the vertical and horizontal directions. Dimensions "A" through "G" are shown which give exemplary dimensions of various points on the mounting pad sections 602 and 604 relative to the center point 606. The dimension given are those found to be representative of an exemplary set of mounting pads and are not intended to limit the inventive arrangement in any way. It should be clear that variations from the exemplary dimensions may be made without departing from the spirit of the present invention. That is, that the mounting pad sections will provide a multiple sized flat pack mounting method and apparatus, in which a plurality of differently sized flat pack component packages may be mounted on the same mounting pads on a circuit board with each package being capable of achieving a concave solder connection between the package and the mounting pads.

Referring again to FIG. 6, the following approximate dimensions, in inches, have been found to provide a mounting pad arrangement which may be implemented to achieve the requisite concave solder joint:

A: 0.015
B: 0.023
C: 0.033
D: 0.012
E: 0.032
F: 0.046
G: 0.058

Again, it should be noted that the above dimensions are given as representative only, and dimensions different from the above may also be implemented since the pad arrangement is designed to allow the achievement of a concave solder joint, as noted above.

In FIG. 7, first and second terminal connection pads or mounting pad sections 700 and 702 are shown along with outlines of a smaller component flat pack 704 and a relatively larger component flat pack 706 in positions as those flat packs may be placed or mounted on the pads. The pads or pad sections 700 and 702 are positioned relative to a center point 708 and have had side sections cutout to pad edges 710 and 712 of the pads, to prevent too much edge solder buildup along the edges of a mounted component package as note above. When the smaller package 704 is mounted, a solder joint will be formed between edges 714 and 716 of the package and edges 710 and 712 of the copper mounting pads 700 and 702, respectively. Because of the cutout section of the pad 700, for example, the distance between the pad edge 710 and the component edge 714 is not wide enough to allow excess solder buildup and the resulting "tombstoning" effect. Similarly, when the larger component package 706 is mounted, the distance between component edges 718 and 720 and pad edges 712 and 710, respectively, is not sufficient to allow excess solder buildup, although still sufficient to provide a strong solder connection.

The apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as defined by the following claims.

We claim:

1. A circuit board having one of two dissimilar sized component packages mounted thereon, the circuit board comprising: a component mounting structure having two connection pads upon which either of said two dissimilar sized component packages are mounted, said connection pads within a predetermined perimeter area, said predetermined perimeter area enclosing said connection pads in a board surface area which is smaller than what would be required if both of said dissimilar sized component packages were mounted to the circuit board, said two connection pads having cutouts on an outer surface to prevent tombstoning when either of said two dissimilar sized component packages are mounted.

2. The circuit board as set forth in claim 1 wherein each of said component packages has at least a first terminal section at one end thereof, and wherein said two connection pads comprise:

a corresponding first terminal connection pad for receiving said first terminal section, said first terminal section and said first terminal connection pad being arranged for receiving a solder joint between said first terminal section and said first terminal connection pad.

3. The circuit board as set forth in claim 2 wherein said solder joint is concave relative to said first terminal connection pad and said first terminal section.

4. The circuit board as set forth in claim 1 wherein said component packages are substantially rectangular, each of said component packages having a first terminal section at a first end of said component package, and a second terminal section at a second end of said component package, said at least two connection pads comprising:

corresponding first and second terminal connection pads for receiving said first and second terminal sections, respectively, said first and second terminal connection pads being arranged for receiving a solder joint between said first and second terminal connection pads and corresponding first and second terminal sections, respectively, of said component packages.

5. The circuit board as set forth in claim 4 wherein said solder joint is concave relative to said first terminal connection pad and said corresponding first terminal section, and between said second connection pad and said second terminal section.

6. A mounting pad on a printed circuit board, for mounting a plurality of components of varying size, the mounting pad comprising:

a first connector pad, etched on a mounting side of the printed circuit board, said first connector pad having at least two connection points to which said components of varying size may be soldered; and a second connector pad, etched on the mounting side of the printed circuit board, electrically isolated from said first connector pad, said second connector pad also having at least two connection points to which said components of varying size may be soldered.

7. The mounting pad as recited in claim 6 wherein said first connector pad and said second connector pad are symmetric about an axis which is longitudinal between said first connector pad and said second connector pad.

8. The mounting pad as recited in claim 6 wherein said at least two connection points on said first connector pad comprise:

a first connection point, to which a connector on one of said components of varying size may be soldered; and a second connection point, extending laterally outward from said first connection point, to which a connector on a second of said components of varying size, being larger than said one of said components of varying size, may be soldered.

9. The mounting pad as recited in claim 8 wherein said at least two connection points on said second connector pad are symmetric with said two connection points on said first connector pad.

10. The mounting pad as recited in claim 6 wherein said first connector pad and said second connector pad have cut outs, surrounding said at least two connection points, such that when said at least two connection points are soldered to connectors on said components of varying size, a cross section of the solder forms essentially a triangle.

11. The mounting pad as recited in claim 10 wherein said triangle has a concave top surface.

12. A surface component mounting pad for connecting two surface mount components having different dimensions to a printed circuit board, the surface component mounting pad comprising:

a first connector pad, etched on a mounting side of the printed circuit board, said first connector pad having two connection points comprising:

a first connection point to which a first connector on a smaller of one of said two surface mount components of varying size may be soldered; and a second connection point, extending outward from said first connection point, to which a first connector on a larger of one of said two surface mount components of varying size may be soldered;

a second connector pad, etched on the mounting side of the printed circuit board, said second connector pad having two connection points comprising:

a first connection point to which a second connector on said smaller of one of said two surface mount components of varying size may be soldered; and a second connection point, extending outward from said first connection point, to which a second connector on said larger of one of said two surface mount components of varying size may be soldered;

wherein said first connection pad and said second connection pad are symmetric about an axis which is longitudinal between said first connector pad and said second connector pad.

13. The surface mount component pad as recited in claim 12 wherein said first connector pad and said second connector pad have cut outs, surrounding said two connection points on said first connector pad and said second connector pad, such that when either of said two connection points on said first connector pad and said second connector pad are soldered to said first and second connectors, respectively, on said components of varying size, a cross section of the solder forms essentially a triangle.

14. The mounting pad as recited in claim 13 wherein said triangle has a concave top surface.

* * * * *